United States Patent [19]

Straughan et al.

[11] 4,292,384

[45] Sep. 29, 1981

[54] GASEOUS PLASMA DEVELOPING AND ETCHING PROCESS EMPLOYING LOW VOLTAGE DC GENERATION

[75] Inventors: Virgil E. Straughan, Euclid; Eugene Wainer, Shaker Hts., both of Ohio

[73] Assignee: Horizons Research Incorporated, Cleveland, Ohio

[21] Appl. No.: 56,165

[22] Filed: Jul. 10, 1979

Related U.S. Application Data

[63] Continuation of Ser. No. 838,297, Sep. 30, 1977, abandoned.

[51] Int. Cl.³ .......................... G03C 5/00; G03C 5/24
[52] U.S. Cl. .......................... 430/5; 156/643; 156/646; 430/299; 430/316; 430/317; 430/318; 430/323; 430/325; 430/330; 430/401; 430/435
[58] Field of Search .................... 156/646, 643; 134/2, 134/19; 430/312, 313, 316, 314, 300, 306, 325, 326, 329, 401, 434, 435, 5, 299, 317, 318, 323, 330

[56] References Cited

U.S. PATENT DOCUMENTS

| | | | |
|---|---|---|---|
| 3,236,707 | 2/1966 | Lins | 156/646 X |
| 3,705,055 | 12/1972 | Christensen et al. | 96/36.3 X |
| 3,733,258 | 5/1973 | Hanak et al. | 204/192 E |
| 3,767,490 | 10/1973 | Alberts | 156/656 |
| 3,837,856 | 9/1974 | Irving et al. | 96/36 X |
| 3,890,176 | 6/1975 | Bolon | 156/646 |
| 3,899,338 | 8/1975 | Lewis | 430/282 |
| 4,092,210 | 5/1978 | Hoepfner | 156/646 X |
| 4,093,461 | 6/1978 | Loprest et al. | 96/35.1 X |
| 4,241,165 | 12/1980 | Hughes | 430/269 |

OTHER PUBLICATIONS

Maissel et al., "Handbook of Thin Film Technology", 1970, 7-42.
Holloway et al., "Detection by Auger Electron Spectroscopy and Removal by Ozonization of Photoresist Residues".

*Primary Examiner*—Edward C. Kimlin
*Attorney, Agent, or Firm*—Lawrence I. Field

[57] ABSTRACT

A device for dry development of photoresists, etching of semiconductor devices, fabrication of photomasks and removal of photoresist materials is described. The device includes a reaction chamber, a means for evacuating the reaction chamber, a supply of and means for introducing one or more reactive gases to the reaction chamber, a controllable relatively low-voltage direct-current power supply to generate a gas plasma in the reaction chamber, planar electrodes to confine the plasma energy to specific target areas in the chamber, means for defining and controlling the temperature of targets to be processed in the chamber and means for modifying and controlling the temperature of the plasma generating gas. The device and the manner of using the same are described.

28 Claims, 11 Drawing Figures

GASEOUS PLASMA DEVELOPING AND ETCHING PROCESS EMPLOYING LOW VOLTAGE DC GENERATION

This is a continuation of application Ser. No. 838,297, filed Sept. 30, 1977, now abandoned.

BACKGROUND OF THE INVENTION

In the manufacture of semiconductor devices, silicon wafers, for example, are oxidized to provide a thin layer of oxide 5,000 to 10,000 A° thick. In order to remove this oxide layer in preselected areas for the dopant diffusion step which produces junctions, a photoresist material is applied to the oxidized wafer surface and subsequently exposed to UV radiation through a suitable mask defining the preselected areas. Depending on whether a positive or negative working photoresist is employed, the exposed or unexposed regions respectively are removed upon subsequent development in a suitable solvent to expose the underlying oxide. A well known method of removing the oxide layer in the exposed areas includes a wet chemical acid etch dip, the resist serving as an acid barrier in the areas on which it remains. Further processing requires a rinsing and drying step, removal of remaining photoresist with a solvent and a further acid rinse to rid the wafer surface of inorganic residues.

More recently, radio frequency (RF) generated plasma devices have been employed to carry out the etching of oxide layers or semiconductor wafers as well as the complete removal of photoresist materials by a procedure known as ashing. With these devices gases and the workpieces within a glass or quartz reaction chamber are inductively coupled to an external RF coil operating usually at 13.56 MHz at power levels of 50 to 300 watts. Under such conditions, the plasma is designated as "cold" and the temperatures within the reaction chamber due to the imposition of the plasma will normally not exceed a maximum of 300° to 350° C. Temperature ranges between approximately 100° and 350° C. will usually be attained in various locations inside the plasma chamber and generally in non-uniform fashion, depending, to some extent, on the size, volume, and location of the workpieces inserted in the plasma area. It has been found that ashing of most photoresists leaves objectionable residues which must be removed in a subsequent processing step. Gaseous plasma etching of $SiO_2$ films may be effected by ionizing certain organo halides in a suitable reactor chamber. Low temperature oxidation of the photoresist is achieved by subjecting it to active oxygen species generated at RF frequencies in a reactor. Even residual inorganic residues from the photoresist may be simultaneously removed by utilizing mixtures of halogen containing gases with oxygen during the ashing procedure. This technique avoids the problem of superficially oxidizing the previously bare silicon surface during normal oxygen plasma ashing procedures.

There are a number of operational problems associated with RF plasma reactions. First of all while the RF power effectively couples to the reactive gas, it also couples to the workpiece at the same time and the system provides no independent means of controlling the temperature of the target or workpiece. Second, there is a non-uniformity of RF coupling to the workpiece and consequently variable rates of chemical reaction with the reactive gas. Furthermore, while the RF generated plasma more or less completely fills the reaction chamber, its concentration and therefore its temperature varies from point to point from target to the chamber wall, contributing again to non-uniform reactivity with the target. The conditions of operation including size, shape, volume, and location of the workpieces must be rigidly controlled since even slight variations from the specified condition will cause the results obtained to vary to an intolerable extent in the precision product. Thus the flexibility of RF plasma operation for development and etching of semiconductors is severly limited, since any change in an operational parameter requires an exhaustive step-by-step tuning process, thus imposing a severe limitation in productivity. In addition, because the plasma extends to the wall of the chamber, it can react with the wall and supply impurities to the specimen depending on the nature of the wall and of the gaseous plasma. For example, when halogen and in particular, fluorine containing etch gases are employed, severe etching of the glass or quartz chamber may be anticipated and may indeed contaminate semiconductor device surfaces as a consequence of the chemical nature of the gases evolved from the chamber wall.

Other semiconductor related processing techniques employing RF plasma include the selective etching of metallic layers such as aluminum or other metal to form leads for semiconductor devices. Again patterned photoresists are employed to act as a barrier and the exposed aluminum or other metal is subjected to a plasma of an appropriate reactive gas or combination of gases usually containing a halogenated hydrocarbon gas. Still another example of RF plasma application to the semiconductor industry is in the preparation of metal or metal oxide on glass photomasks. Here again an imaged and developed photoresist barrier pattern over an underlying layer of chromium or iron oxide on glass permits gaseous plasma chemical attack by reactive species of gases such as chlorine, boron trichloride, and phosphorus pentachloride mixed with oxygen. Following this etching procedure the remaining photoresist can be chemically degraded and removed in an oxygen plasma or removed by means of a solvent outside the plasma reactor.

The object of this invention is to provide a plasma reactor device which will achieve uniformity of reactivity of the gaseous plasma over the entire target area. Another object is to provide distinct and independent means of defining and controlling the temperature of the plasma and that of the target or workpiece. Still another object is to provide a well defined and concentrated region of reactive gaseous plasma confined largely to the target areas and away from the walls of the reaction chamber. Further, an object of the present invention is to provide an effective plasma device in which the plasma is generated by a direct-current power supply which is less expensive and more stable than a radio frequency generated plasma and which does not require Federal Communication Commission approval. It is still a further object of this invention to provide controllable flexibility to plasma reactions and inter-reactions for the manufacture of semiconductors and other devices to be produced by photomechanical means which eliminates the need for exhaustive step-by-step tuning in the case of adventitious or deliberate change in any operating parameter.

Other objects, design characteristics and advantages will be obvious from description, preferred embodiments and accompanying drawings which follow.

SUMMARY OF THE INVENTION

The apparatus of the present invention includes a relatively low-voltage direct-current source to generate reactive gaseous species in the form of a plasma within the reactor instead of by radio frequency generation. By the appropriate selection of electrode size and spacing between electrodes, the ionizing energy and reactive species within the plasma can be confined to the target area whether it be a single target or a series or group of semiconductor wafers, photomasks, or printed circuit boards.

In the processing of silicon wafers in the manufacture of semiconductor devices photoresist materials may be utilized for a completely dry processing system employing the present direct-current generated plasma process. A particularly preferred photoresist is described in U.S. Pat. No. 3,899,338 issued Aug. 12, 1975. The foregoing patent can be summarized by the generalized form as given in claim 1 and for sake of emphasis the formula range as given in column 14 of the referenced patent as for example, monomer taken from Table I, N-vinyl carbazole being preferred with or without crosslinking agent as taken from Table 2, N,N'-diallyl aniline being preferred; a stabilizer such as 2,6-ditertbutyl-p-phenol; a binder and solvents taken from Table 3, column 12 and finally an activator, preferred activators being iodoform, tetraiodomethane and tetraiodoethylene. One or more silicon wafers previously treated so as to form an adherent oxide layer of the order of 5,000 to 10,000 A° are coated with the photoresist composition by spinning, or any other suitable method. After drying and exposure through a photomask, the wafers are heated to fix the resulting image in the photoresist and render the photoresist insensitive to further illumination. The wafers are then inserted between electrodes in the plasma reactor of this invention and subjected to a low pressure oxygen atmosphere which is energized by the application of low voltage direct-current to the electrodes, subsequently producing active oxygen species which readily react with the photoresist material. We have discovered that the unexposed areas of the photoresist material react with the active oxygen species at a rate two or three times faster than the exposed areas which results in dry development of the photoresists through complete removal in the unexposed areas before the exposed areas are adversely affected. By the addition of 1 to 20% water vapor based on the content of oxygen, the removal rate is multiplied by a factor of 2 to 7 without any noticeable effect on the exposed areas of the photoresist. High resolution development may be realized in this manner, resulting in line width of two micrometers or less. Air at reduced pressure can be utilized in the same way as oxygen, but the rate of oxidation using pure oxygen is three to five times greater.

By pumping out the oxygen and admitting other reactive gases such as organo halides, for example $CF_4$, alone or in combination with other gases, a second dry processing step, that of reacting with and removal of the $SiO_2$, $Si_3N_4$ or other coatings beneath the previously unexposed photoresist areas can be readily accomplished employing again the low voltage generated plasma of the present invention. We have further found that by utilizing a mixture of water vapor, oxygen and organo halides we can not only develop the photoresist by complete removal of the resist in unexposed areas without deleteriously affecting the exposed areas but by continuation of the process under preselected conditions for a time factor approximately twice that required for development of the resist, the desired degree of substrate etching can also be accomplished.

Furthermore, wafers coated with a photoresist and which have already been developed by a wet method may be further processed in the direct current plasma reactor by selectively removing the $SiO_2$, $Si_3N_4$ or other coatings such as chromium and aluminum by the appropriate choice of reactive gases. This ability makes this process also useful in the fabrication of glass-metal photomasks (e.g. chromium vapor deposited or sputtered on glass).

Still a third processing step, that of complete removal of the exposed photoresist, can be effected sequentially without handling the wafer targets by pumping out the reactor system, admitting oxygen, and/or oxygen plus water vapor and again producing active oxygen containing species by low-voltage direct-current plasma generation. The wafers are now clean and ready for the dopant diffusion step.

Some photoresists are known to leave behind inorganic residues after completely ashing the organic materials. This problem can be effectively avoided by employing a mixture of oxygen and halogen-containing gases to react with the inorganic residues to form gaseous products which are exhausted from the system.

The rate of reaction of photoresist with reactive oxygen or $SiO_2$ removal by halogen-containing gases can be controlled by the plasma power, i.e. (voltage X current), temperature of the reactive gases and temperature of the target (e.g. wafers). Plasma current is responsive to the applied voltage, gas pressure within the reactor and the specific characteristics of the gas. The temperature of the target may be defined by controlling the temperature of the platen on which it rests, e.g. by resistive heating or by cooling with cooling coils or by means of thermoelectric devices and the target may be heated by radiation from an infrared source. The plasma itself contributes toward heating the target. In a preferred manner of operation, complete control is realized by a combination of platen temperature control and control of the heating or cooling furnished by additional sources.

Plasma temperature may be independently increased and controlled by any one means or a combination of any or all of the above described means. By resistively heating the gas-manifold delivery tube, the gas may be delivered at any desired temperature to the plasma region through the upper electrode which consists of either a planar screen or multiple fine parallel wires stretched on a frame. Alternatively the gas stream from the delivery manifold may be heated by radiation from an infrared source on one side with a reflector on opposite side to increase the effect or by infrared sources on opposite side, or by an infrared source above the gas delivery manifold and active species generating screen-electrode where the radiation can pass through both plasma regions, i.e. above and below the screen and even impinge on the targets as well, these alternatives being available to supplement the temperature control which is available through control of the platen temperature.

DESCRIPTION OF PREFERRED EMBODIMENT

Figure 1:
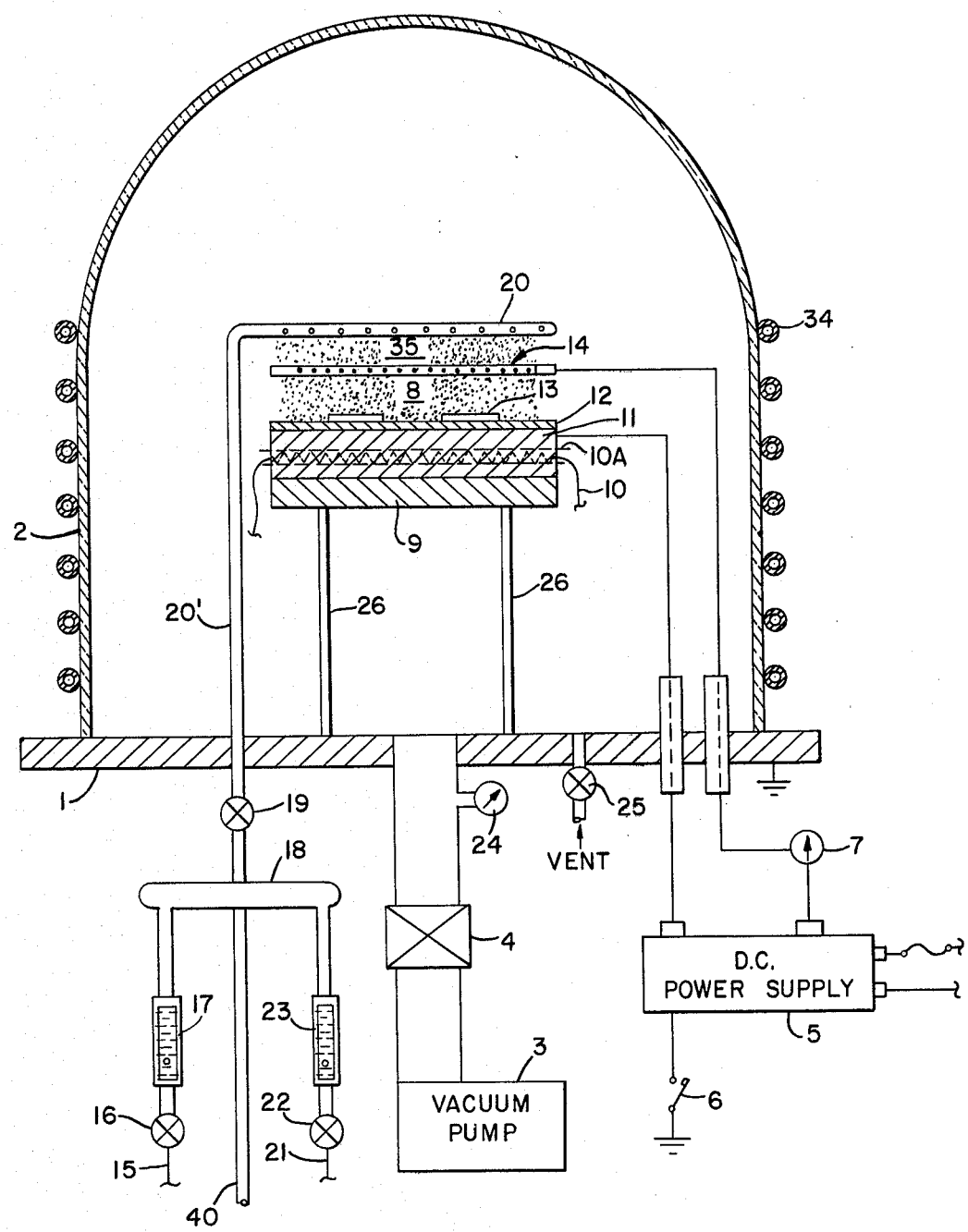
FIG. 1 is a diagrammatic illustration of a reactor for producing a reactive gaseous plasma by direct-current generation.

FIG. 1 illustrates diagrammatically an apparatus for carrying out the process of the present invention. The apparatus includes a reaction chamber and means for producing a direct-current generated plasma. The reaction chamber comprises a base plate 1 on which a bell jar 2 is supported. The bell jar and/or base plate may be prepared to insure that they engage in a good seal. A mechanical vacuum pump 3 is connected to the bell jar 2 so as to produce a vacuum in the bell jar. The vacuum system includes valves 4 and 25 which control the admission and discharge of gases to and from the bell jar, and a low pressure gauge 24 for monitoring the pressure in the vacuum line. Bell jar 2 is provided with a coil 34 for cooling or heating the bell jar. Means for admitting oxygen and organic halide or other reactive gases to the bell jar include a conduit 20' extending into the bell jar and terminating in a multiholed delivery tube 20. Conduit 20' is provided with a valve 19 positioned between the outlet of delivery tube 20 and a manifold 18. Manifold 18 receives one or more gases supplied under pressure from suitable sources. Oxygen is supplied from an oxygen supply through a conduit 15 having a flow control valve 16 and a flow meter 17 disposed between the oxygen supply and the manifold 18. Water vapor is supplied to manifold 18 by means of another conduit 40, preferably entrained in a stream of oxygen. Organo halide or other reactive gas is supplied to manifold 18 by one or more conduits 21 each connected to the manifold 18 through a valve 22 and flow measuring device 23 and each connected to its individual supply of gas under pressure. The gases to be introduced into bell jar 2 are mixed in manifold 18 as they are being delivered into the vicinity of targets 13 in the bell jar.

The targets 13 which may be semiconductor wafers 13 or photomasks 13 are shown resting on an electrically conducting removable platen 12 which in turn rests on an electrode 11 which can be heated by applying power to a resistive element 10 within or adjacent to the electrode. Electrode 11 in turn rests on heat insulating member 9 which is supported on base plate 1 by legs 26 so that member 9 is spaced from base 1.

An electrode 14 is positioned above targets 13 parallel to the targets and spaced a suitable distance from them.

A concentrated plasma shown as a dotted region is generated in the region 8 between electrodes 14 and 11 as well as in region 35 above electrode 14 when the electrodes are connected through high voltage feedthroughs to a 0-1000 V DC floating power supply 5 which may be optionally grounded through a switch 6.

A meter 7 is provided for indicating the voltage or the current applied to electrode 14. Electrode 14 is preferably a multiple corona wire unit but electrodes composed of stretched wire screen or a flat sheet of any conductor have also been found suitable. The upper electrode 14 may be connected to either terminal of DC power supply 5. However, for an oxygen atmosphere, it is made negative and electrode 11 is made positive.

In operation the semiconductor wafers 13 or other targets (e.g. photomasks) are placed on platen 12 and brought to the required operating temperature by heating means 10 or by a cooling tube 10A. The reactor chamber and conduit system down to flow meters 17 and 23 is evacuated to a pressure of $10^{-3}$ torr. In a typical photoresist development procedure, molecular oxygen is admitted to a system pressure between 0.05 and about 5 torr. A plasma is generated when DC voltage is applied from power supply 5 which may run at 350 to 600 volts at an energization current of about 100 ma. The operating parameters may vary depending on the activation characteristics of the gases utilized. In general, the rate of etching is determined by the concentration of active species which increases directly with increase in gas pressure or applied voltage within the current limitations of the power supply. Another parameter of operation is the temperature of the target and gas plasma. As with most chemical reactions, as the temperature of the reactants increases so does the rate of reaction. Temperature measurements have confirmed that the gaseous plasma generated in the reactor of this invention is a cold plasma.

FIGS. 1A through 1D show various means found suitable, to independently control the temperature of the gaseous plasma, these figures being schematic views of the plasma region in the apparatus of FIG. 1.

Figure 1A:
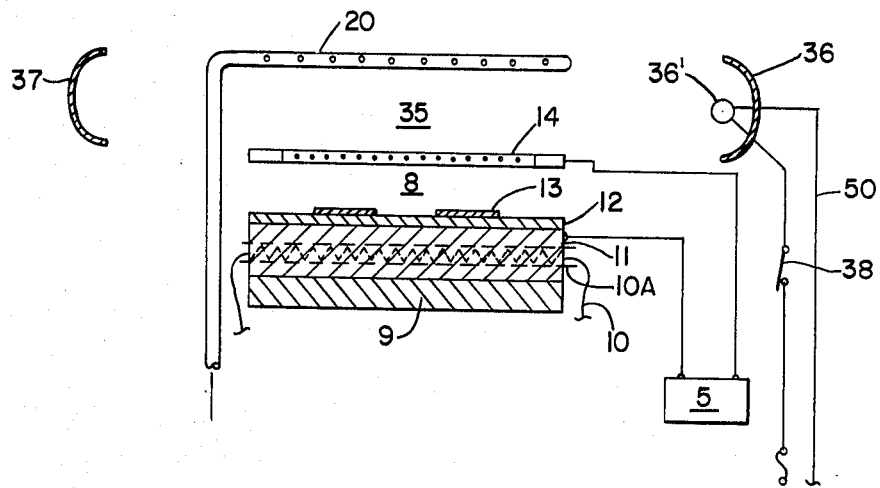
FIG. 1A is an illustration of the plasma generating region of the reactor of FIG. 1 showing how the gas can be heated by a side mounted radiant source and reflectors.

FIG. 1A illustrates means for heating the gas being introduced into the reactor through the delivery tube 20. As shown the gas is heated by radiation from a heat source 36' and a reflector 36 which is mounted opposite to a second reflector 37 in order to enhance the heating effect on the gas. Heat source 36' is connected to a power supply by suitable leads 50 through a switch 38.

Figure 1B:
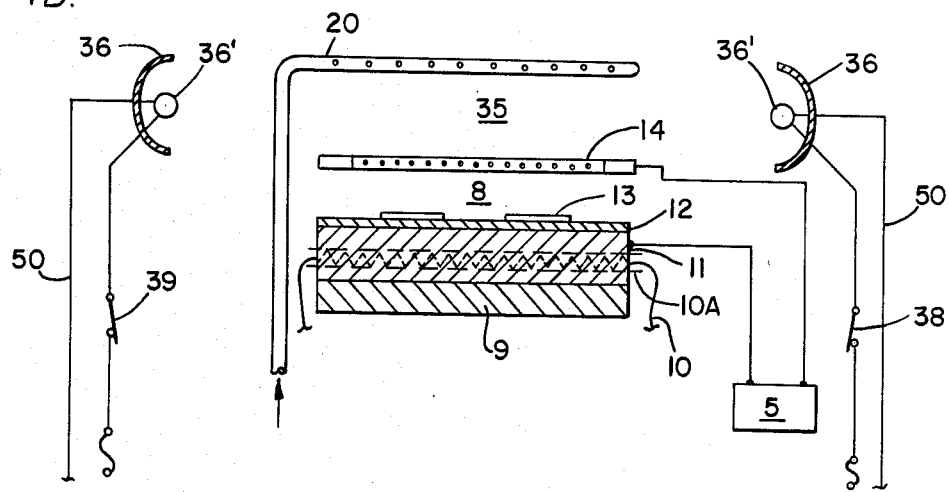
FIG. 1B is the same as FIG. 1A except that two radiant heat sources and reflectors facing one another are employed.

FIG. 1B is similar to FIG. 1A except that instead of reflector 37, a second radiation source 36' is mounted on the opposite side of the plasma region 35. Leads 50 and switch 39 connect heater 36' to its power supply.

Figure 1C:
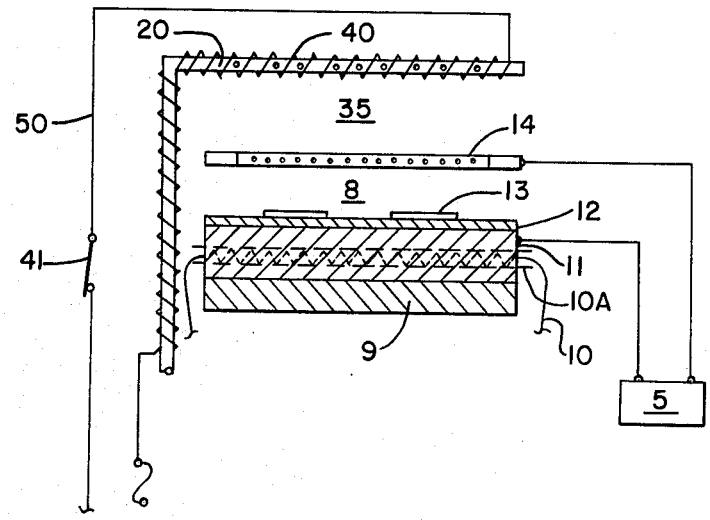
FIG. 1C is an illustration of the plasma generating region of the reactor of FIG. 1 showing how the delivery gas can be preheated by resistively heating the delivery tube.

FIG. 1C shows resistance coil 40 wrapped around delivery tube 20 in order to heat the gas supplied to the reaction chamber 2. A switch 41 and leads 50 is provided for coil 40 connecting to a power supply.

Figure 1D:
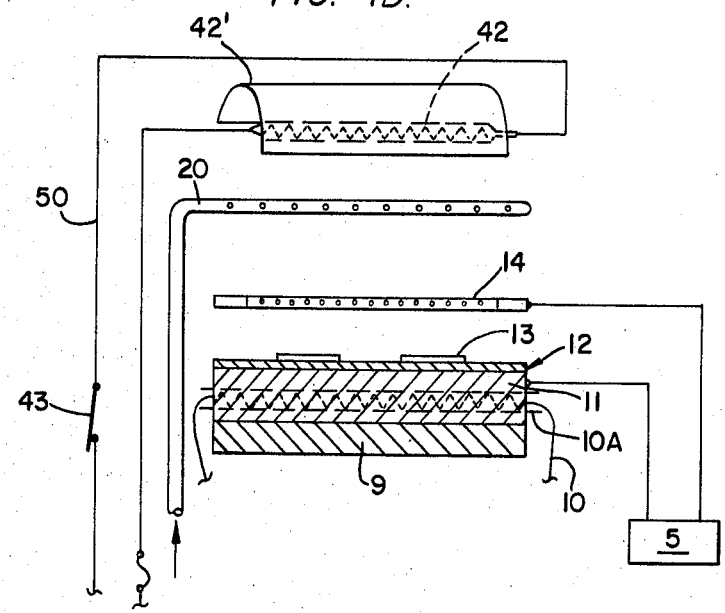
FIG. 1D is an illustration of the plasma generating region of FIG. 1 which shows a radiant heating source and reflector positioned directly above gas delivery tube, plasma electrode, and target.

FIG. 1D shows a radiation source 42' and reflector 42 mounted above gas delivery tube 20. In this arrangement the heating effects of the radiation source 42' are applied to the gas emanating from tube 20, the plasma in both region 35 above and region 8 below electrode 14, respectively and the targets 13.

Figure 1E:
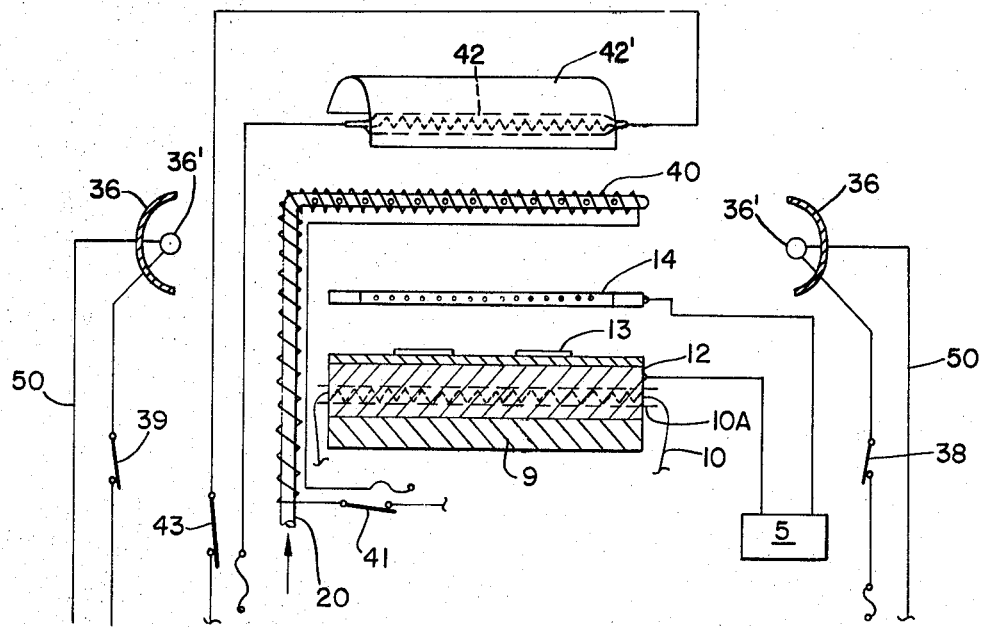
FIG. 1E is an illustration incorporating all or any combination of the gas plasma heating sources described in FIGS. 1A, 1B, 1C, and 1D.

FIG. 1E is intended to show all of the heating means of FIGS. 1A, 1B, 1C and 1D and illustrates that by closing one or more of the switches 38, 39, 41 and 43 any combination of the gas heating means may be utilized.

Figure 2A:
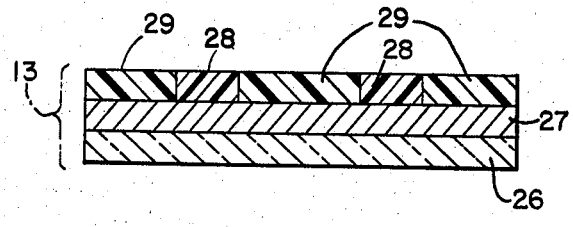
FIGS. 2A, 2B, 2C and 2D are illustrations in cross sectional view of a semiconductor wafer or photomask in four processing states of its fabrication.

FIGS. 2A, 2B, 2C and 2D illustrate in cross-sectional view various stages of fabrication in the practice of this invention. Thus, FIG. 2A represents in cross-sectional view a photomask plate consisting of a glass material 26, a metal or metal oxide layer 27 (e.g. metallic chromium or iron oxide 500–1000 A°), and a photoresist material 28 and 29. The regions 28 and 29 differ only in that 29 has been exposed to UV and 28 has not been exposed to UV. Or, FIG. 2A represents a semiconductor device in one stage of fabrication where, for example, silicon wafer 26 is coated with an oxide or nitride 27 to which has been applied a photoresist material 28. Areas 29 of the photoresist have been exposed to UV radiation.

Figure 2B:
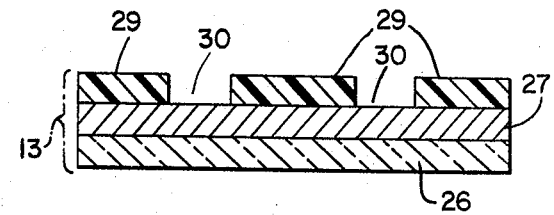

FIG. 2B shows a cross-sectional view after the unexposed areas 28 have been removed by the active oxygen plasma treatment of this invention thereby providing openings 30 down to the layer 27.

Figure 2C:
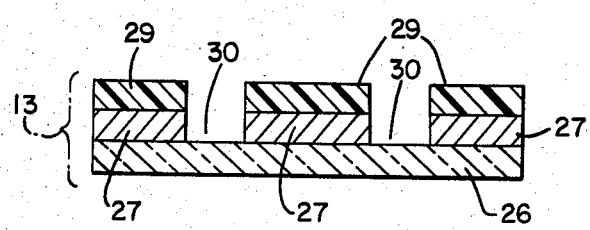

FIG. 2C is a cross-sectional view of the device after having been treated by a second gas plasma selected to react with layer 27 (whether it be a metallic deposit on glass as in the case of a photomask or a silica, silicon nitride or metallic layer on a silicon semiconductor wafer).

Figure 2D:
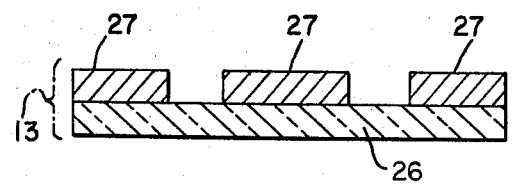

FIG. 2D illustrates in cross-sectional view the resulting device after a further processing step in the direct-current generated gas plasma apparatus of this invention, namely, total removal of the remaining photoresist 29 by a low pressure energized oxygen plasma.

Figure 3:
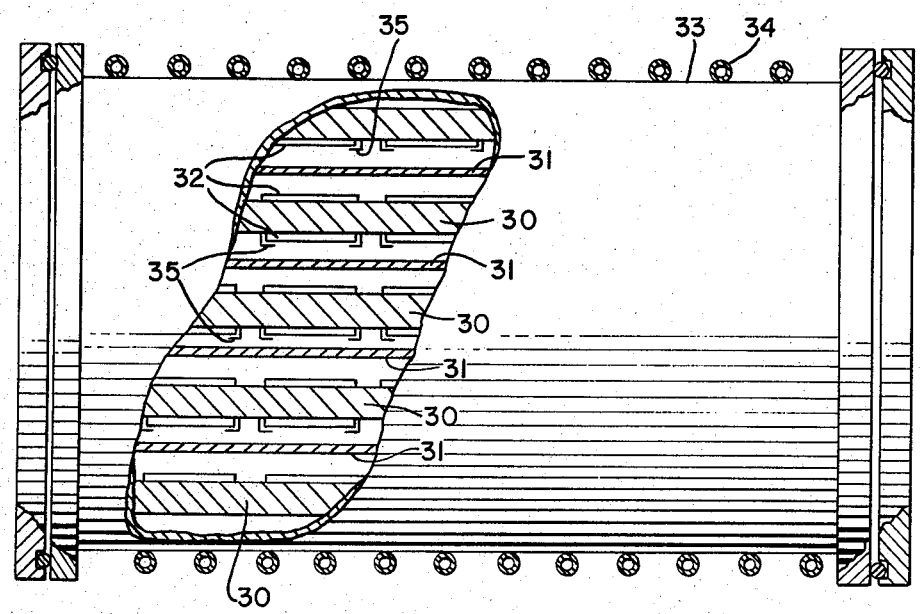
FIG. 3 is an illustration of an alternate design for a direct-current plasma reactor specifically to accommodate a large number of semiconductor wafers.

FIG. 3 is a view of a second plasma reactor design utilizing the principles of the present invention for the processing of a large number of wafers 13 at one time. The reactor consists of a cylindrical vacuum chamber 33 with other elements of the equipment such as the vacuum pump, gas admitting system and DC power supply shown in FIG. 1 omitted for simplicity of illustration. Shown are banks of parallel electrodes 30 and 31 which are parallel connected respectively to a direct-current power supply (not shown). Targets 32 are mounted on both the upper and lower surfaces of electrode 30 being held in place on the undersides by clips 35. Electrodes 30 may be made removable for loading and are resistively heated or cooled as required so as to bring semiconductor wafers and other targets to the desired processing temperature. Heating or cooling of the entire reactor chamber and contents may be achieved by circulating a heat exchange liquid through coil 34. It has been found that a direct-current generated plasma extends above and below electrode 31 so that the multiple electrode arrangement takes full advantage of the reactive plasma cloud. A 1" spacing between electrodes is satisfactory.

The examples in Table I set forth operating parameters of the direct-current generated plasma device of this invention, as applied to the processing of various target materials and are intended to illustrate the invention, and not to limit the same.

In the practice of this invention, e.g. as in the Examples which follow, the temperature of the temperature controlled platen on which the silicon wafers or other workpieces rest was adjusted by means of employing a thermo-couple sensor, temperature controller and heating or cooling means as required. When a removable platen was used it was first brought to operating temperature before loading while resting on the temperature controlled platen. A separate temperature sensor is inserted in the removable platen for close temperature monitoring.

Next, wafers, photomasks or other workpieces were loaded onto the temperature adjusted platen adjacent to the plasma generating electrode and the bell jar was lowered into position on the baseplate. A vacuum tight seal was provided by a neoprene gasket covered with a light film of silicone vacuum grease. The vent valve was then closed and the valve to the vacuum pump was opened compeltely and the vacuum pump motor was energized. The system was pumped to a low pressure of at least $2.5 \times 10^{-2}$ torr and preferably to $1 \times 10^{-3}$ torr as determined by a thermo-couple type pressure gauge.

Next, the appropriate gas or mixture of gases was admitted into the reactor adjacent to the plasma generating electrode through the common delivery tube. The flow rate of each gas was adjusted independently as required and the final system pressure was achieved by partially closing the vacuum valve since the vacuum pump was one with excess pumping capacity. The thermo-couple gauge was no longer suitable for measuring the system pressure since gases vary in their thermal conductivity and this type of gauge must be calibrated separately for each gas. Consequently, a digital diaphragm vacuum gauge was employed which responsed to total pressure and is independent of the gases employed in the reactor.

Once all of the above mentioned steps have been taken and the system was stabilized, the DC power supply was activated and the voltage adjusted to the prescribed value which was typically 400 to 500 volts. The plasma power is calculated as the product of the voltage and plasma current which is typically set at 100 ma providing a plasma power level of 40 to 50 watts.

When auxiliary heating of the gaseous plasma was employed one or more of the heating sources provided was energized as required to reach the desired temperature within the plasma. Plasma temperature was monitored by means of a focusing infrared pyrometer. After a prescribed length of time as determined from a series of earlier experiments the DC power supply was turned off and any auxiliary plasma heating sources employed were also turned off.

When dry plasma development of the photoresist was the only operation to be carried out, the reactant gas supply was cut off followed by turing off the vacuum pump and admitting air through the vent valve to the bell jar reactor until atmospheric pressure is reached. Then the bell jar was raised and the wafers or other workpieces were removed for other processing steps.

When subsequent etching steps were carried out on the wafers after photoresist development, the system was not filled with air but instead was evacuated again to $1 \times 10^{-3}$ torr following which other gases were admitted to carry out the desired etching step. After completion of the etching step, the reactant gas supply was cut off and the previously described procedure was followed to remove the wafers or other workpieces from the bell jar.

When it is desired to dry develop the photoresist and etch the substrate in the same mixture of reactive gases in order to save processing time, once the initial steps of temperature adjustment, workpiece loading and pump-down are completed, a mixture of gases including oxygen, water vapor and an organo halide is introduced, DC voltage is applied to the plasma generating electrodes and the plasma auxiliary heating means are activated as required to achieve a plasma temperature typically in the range of 100° to 150° C. The photoresist is removed preferentially in the unexposed areas and by continuing the process, the reactive gases then etch the substrate, for example the SiO₂ layer on silicon. Once the etching is complete, the power supply and reactive gas supplies are turned off and the reactor evacuated to $10^{-3}$ torr. Next, a mixture of oxygen and water vapor is admitted to the reactor, the power supply is reactivated and the remaining photoresist is completely removed. From this point, steps are taken as indicated previously to close down the operation and remove the workpieces.

TABLE I

Reactor is evacuated to $10^{-3}$ torr before gas or gaseous mixture is admitted to system. Photoresist used is that described in U.S. Pat. No. 3,899,338 coated to thickness of 1.2 micrometers (a negative-working resist).

| Ex. | Target | Objective | Platen Temp. °C. | Reactive Gas |
|---|---|---|---|---|
| 1. | Photoresist on 2" Si Wafers | Develop photoresist | 100 | O₂ |
| 2. | Photoresist on 2" Si Wafers | Develop photoresist | 60 | O₂ |
| 3. | Photoresist on 2" Si Wafers | Develop photoresist | 150 | O₂ |
| 4. | Photoresist on 2" Si Wafers | Develop photoresist | 150 | 95% O₂ + 5% H₂O |
| 5. | Photoresist on 2" Si Wafers | Develop photoresist | 150 | O₂ |
| 6. | Photoresist on 2" Si Wafers | Develop photoresist | R.T. | O₂ |
| 7. | Photoresist on 2" Si Wafers | Develop photoresist | 100 | O₂ |
| 8. | Photoresist on 2" Si Wafers | Develop photoresist | 150 | Air |
| 9. | Photoresist on 2" Si Wafers | Develop photoresist | 100 | O₂ |
| 10. | Photomask-chrome on glass | Etch chrome | 150 | 60% O₂ + 40% C₂HCl₃ |
| 11. | Developed photoresist on 2" oxidized Si wafer | To etch away SiO₂ layer, selectivity | 100 | 10% O₂ 90% CF₄ |
| 12. | Developed photoresist on 2" Si₃N₄ coated Si wafer | To etch away Si₃N₄ layer, selectively | 100 | 10% O₂ 90% CF₄ |
| 13. | Developed photoresist mask on 2" aluminized wafers | To selectively etch away aluminum coating | 100 | BCl₃ |
| 14. | Photoresist on 2" Oxidized Si Wafers | To sequentially develop photoresist and etch SiO₂ in same gases in single step | 100 | 45% O₂— 50% CF₄— 5% H₂O |

| Ex. | System Pressure (torr) | Radiation Power (Watts) | Potential on Electrodes (DC Volts) | Plasma Current (ma) |
|---|---|---|---|---|
| 1. | 0.1 | 150 | 400 | 25 |
| 2. | 0.1 | 150 | 400 | 25 |
| 3. | 0.1 | 150 | 400 | 25 |
| 4. | 0.1 | 150 | 400 | 25 |
| 5. | 0.1 | None | 400 | 70 |
| 6. | 0.15 | None | 480 | 100 |
| 7. | 0.05 | None | 800 | 10 |
| 8. | 0.15 | None | 1200 | 20 |
| 9. | 0.3 | None | 400 | 400 |
| 10. | 0.1 | None | 400 | 75 |
| 11. | 0.15 | None | 450 | 75 |
| 12. | 0.15 | None | 450 | 75 |
| 13. | 0.1 | None | 400 | 50 |
| 14. | 0.1 | None | 400 | 25 |

TABLE I-continued

Reactor is evacuated to $10^{-3}$ torr before gas or gaseous mixture is admitted to system. Photoresist used is that described in U.S. Pat. No. 3,899,338 coated to thickness of 1.2 micrometers (a negative-working resist).

| | Plasma Electrode | | Etch Rate of Photoresist | |
|---|---|---|---|---|
| Ex. | Power (Watts) | Spacing (inches) | Exposed Area (A°/min.) | Unexposed Area (A°/min.) |
| 1. | 10 | 1 | 200 | 500 |
| 2. | 10 | 1 | 180 | 450 |
| 3. | 10 | 1 | 250 | 700 |
| 4. | 10 | 1 | 500 | 1400 |
| 5. | 28 | 1 | 500 | 1400 |
| 6. | 48 | 1 | 300 | 770 |
| 7. | 8 | 1 | 150 | 375 |
| 8. | 24 | 1 | 40 | 100 |
| 9. | 160 | 1 | 1330 | 3500 |
| 10. | 30 | 1 | 80 | |
| 11. | 38 | 1 | 900 | |
| 12. | 38 | 1 | 800 | |
| 13. | 20 | 1 | 300 | |
| 14. | 10 | 1 | P.R.-200 SiO₂-500 | P.R.-500 |

In the preceding examples, the photoresist utilized in practicing the invention has been the resist described in U.S. Pat. No. 3,899,338 issued Aug. 12, 1975, the disclosure of which is intended to be incorporated in this application by this reference, this being a particularly preferred photoresist. However, the invention is not limited to the use of the compositions described in that patent since it has been practiced with other photoresist compositions including those described in U.S. Pat. No. 3,820,993 issued June 28, 1974 and U.S. Pat. No. 3,883,351 issued May 13, 1975 and others of a similar nature.

Having now described preferred embodiments of the invention, it is not intended that it be limited except as may be required by the foregoing claims.

We claim:

1. In the processing of silicon wafers in the manufacture of semiconductor devices, wherein the wafers are treated to form an adherent oxide layer on one surface thereof, of a thickness between about 5000 and 10,000 A° and the oxide layer is then coated with a photoresist composition, and said composition is then dried and then exposed to a pattern of radiation and the coated wafers are thereafter heated to fix an image formed in said photoresist, and then the photoresist is then developed, the improvements which comprise:

developing the photoresist by dry means by subjecting the photoresist composition on said wafers to a low pressure oxygen containing atmosphere which has been energized by application of low voltage direct-current to electrodes positioned adjacent said wafers, whereby the areas of said photoresist which were not exposed to said radiation are removed from said wafers by oxidation in a plasma; and providing as said photoresist composition, a composition which comprises the following materials dissolved in a resin binder;

at least one polymerizable N-vinyl monomer;

at least one photoactivator selected from the group of organic halogen compounds in which at least two halogen atoms are attached to a single carbon atom, sulfonyl halides, and mercapto compounds in which the mercapto group is attached to a carbon atom in a heterocyclic nucleus.

2. The process of claim 1, wherein the oxygen-containing atmosphere is pure oxygen.

3. The process of claim 1 wherein the oxygen-containing atmosphere is a mixture consisting of pure oxygen and 1-20% of water vapor by volume of the oxygen.

4. The process of claim 1 wherein the oxygen-containing atmosphere is a mixture of pure oxygen 1-20% by volume of water vapor and an organo halide gas 5. The process of claim 4 wherein both the photoresist composition and the oxide layer are removed from said wafers.

6. The process of claim 1 wherein the wafer is supported on a first electrode and a second electrode is spaced adjacent to the coated surface of said wafer and a plasma is generated by the application of said low voltage direct-current between said electrodes.

7. The process of claim 1 including a second dry processing step comprising removing the oxygen containing atmosphere and replacing it with a low pressure organo-halide, generating a low voltage plasma between said electrodes and removing the oxide coating from the areas of said wafer from which the photoresist has been removed by the preceding dry processing step.

8. The process of claim 7 wherein the period of time to which the wafer is subjected to the energized oxygen-containing gas is extended past the time required for removal of the oxide coating and for a time sufficient to etch the wafer.

9. The process of claim 8 wherein the oxygen-containing gas consists of a mixture of pure oxygen and 1-20% by volume of water vapor.

10. The process of claim 7 including the further step of replacing the organo-halide atmosphere with a low pressure oxygen-containing atmosphere and generating a low voltage plasma therein to effect removal of the remainder of the photoresist.

11. The process of claim 1 wherein the photoresist composition includes a substituted phenol represented by the general formula

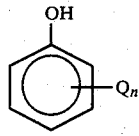

in which Q represents one or more hydroxyl groups, amino groups, alkyl or allyl groups and not all the Q's need to be the same and n is an integer from 1 to 5.

12. The process of claim 7 in which the organo halide is selected from the group consisting of halogen substituted methanes, ethanes and ethylenes.

13. The process of claim 1 wherein the N-vinyl monomer is N-vinyl carbazole.

14. The process of claim 1 wherein the photoactivator is tetraiodoethylene.

15. In the processing of wafers in the manufacture of photomasks, wherein the wafers are coated with an adherent metal or metal oxide layer on one surface thereof, of a thickness between about 5000 and 10,000 A° and said coating is then further coated with a photoresist composition, and the composition is dried and exposed to a pattern of radiation and the wafers are thereafter heated to fix an image formed in said photoresist, and the photoresist is then developed, the improvements which comprise:

providing as said photoresist composition a composition which comprises the following materials dissolved in a resin binder:

at least one polymerizable N-vinyl monomer;

at least one photoactivator selected from the group of organic halogen compounds in which at least two halogen atoms are attached to a single carbon atom, sulfonyl halides, and mercapto compounds in which the mercapto group is attached to a carbon atom in a heterocyclic nucleus; and subjecting the photoresist composition on said wafers to a low pressure oxygen containing atmosphere which has been energized by application of low voltage direct-current to electrodes positioned adjacent said wafers, whereby the areas of said photoresist which were not exposed to said radiation are removed from said wafers.

16. The process of claim 15 wherein the oxygen-containing atmosphere is pure oxygen.

17. The process of claim 16 wherein the oxygen-containing atmosphere is a mixture consisting of pure oxygen and 1-20% of water vapor by volume of the oxygen.

18. The process of claim 15 wherein the oxygen-containing atmosphere is a mixture of pure oxygen, 1-20% by volume of water vapor and an organo-halide gas.

19. The process of claim 18 wherein both the photoresist composition and the metal or metal oxide layer are removed from said wafers.

20. The process of claim 15 wherein the wafer is supported on a first electrode and a second electrode is spaced adjacent to the coated surface of said wafer and a plasma is generated by application of said low voltage direct-current between said electrodes.

21. The process of claim 15 including a second dry processing step comprising removing the oxygen containing atmosphere and replacing it with a low pressure organo-halide, generating a low voltage plasma between said electrodes and removing the metal or metal oxide coating from the area of said wafer from which the photoresist has been removed by the preceding dry processing step.

22. The process of claim 21 wherein the period of time to which the wafer is subjected to the energized oxygen-containing gas is extended past the time required for removal of the metal or metal oxide coating and for a time sufficient to etch the wafer.

23. The process of claim 22 wherein the oxygen-containing gas consists of a mixture of pure oxygen and 1-20% by volume of water vapor.

24. The process of claim 21 including the further step of replacing the organo-halide atmosphere with a low pressure oxygen-containing atmosphere and generating a low voltage plasma therein to effect removal of the remainder of the photoresist composition.

25. The process of claim 15 wherein the photoresist composition includes a substituted phenol represented by the general formula

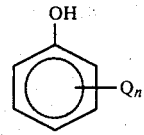

in which Q represents one or more hydroxyl groups, amino groups, alkyl or allyl groups and not all the Q's need to be the same and n is an integer from 1 to 5.

26. The process of claim 21 in which the organo- halide is selected from the group consisting of halogen substituted methanes, ethanes and ethylenes.

27. The process of claim 15 wherein the N-vinyl monomer is N-vinyl carbazole.

28. The process of claim 15 wherein the photoactivator is tetraiodoethylene.

* * * * *